US011275399B2

(12) United States Patent
Sugiura et al.

(10) Patent No.: US 11,275,399 B2
(45) Date of Patent: Mar. 15, 2022

(54) REFERENCE VOLTAGE CIRCUIT INCLUDING DEPLETION TYPE AND ENHANCEMENT TYPE TRANSISTORS IN A COMMON CENTROID ARRANGEMENT

(71) Applicant: ABLIC Inc., Chiba (JP)

(72) Inventors: Masakazu Sugiura, Chiba (JP); Fumihiko Maetani, Chiba (JP)

(73) Assignee: ABLIC INC., Chiba (JP)

( * ) Notice: Subject to any disclaimer, the term of this patent is extended or adjusted under 35 U.S.C. 154(b) by 432 days.

(21) Appl. No.: 15/994,075

(22) Filed: May 31, 2018

(65) Prior Publication Data

US 2018/0348807 A1    Dec. 6, 2018

(30) Foreign Application Priority Data

Jun. 1, 2017    (JP) .............................. JP2017-109043

(51) Int. Cl.
*G05F 3/26*        (2006.01)
*H01L 27/088*    (2006.01)

(52) U.S. Cl.
CPC .......... *G05F 3/262* (2013.01); *H01L 27/0883* (2013.01)

(58) Field of Classification Search
CPC .......... G05F 3/02; G05F 3/16; G05F 3/20–30; G05F 3/242; G05F 3/262; H01L 27/0207–0211; H01L 27/0883
USPC .................. 323/271–289, 313, 315; 327/541
See application file for complete search history.

(56) References Cited

U.S. PATENT DOCUMENTS

| | | | | |
|---|---|---|---|---|
| 4,247,860 A | * | 1/1981 | Tihanyi | H01L 29/105 257/404 |
| 4,318,040 A | * | 3/1982 | Hilbourne | G05F 1/56 323/312 |
| 4,395,645 A | * | 7/1983 | Pernyeszi | H03K 19/018507 326/120 |
| 4,593,214 A | * | 6/1986 | Proebsting | G05F 3/242 327/390 |
| 4,614,882 A | * | 9/1986 | Parker | G06F 13/4072 326/30 |
| 4,638,241 A | * | 1/1987 | Colles | G05F 3/247 323/312 |
| 4,752,702 A | * | 6/1988 | Gaibotti | H03K 19/01714 326/88 |

(Continued)

FOREIGN PATENT DOCUMENTS

| | | |
|---|---|---|
| CN | 1359156 A | 7/2002 |
| JP | 2009-021360 A | 1/2009 |

(Continued)

OTHER PUBLICATIONS

Office Action in Japan Application No. 2018-060317 A, dated Dec. 14, 2021, 3 pages.

*Primary Examiner* — Thienvu V Tran
*Assistant Examiner* — Nusrat Quddus
(74) *Attorney, Agent, or Firm* — Crowell & Moring LLP

(57) ABSTRACT

There is provided a reference voltage circuit which includes a depletion type transistor and an enhancement type transistor. At least one of the depletion type transistor and the enhancement type transistor is formed from a plurality of transistors and the reference voltage circuit is arranged in the form of a common centroid (common center of mass) to avoid the influence of a characteristic fluctuation due to stress from the resin encapsulation of a semiconductor device or the like.

6 Claims, 8 Drawing Sheets

(56) References Cited

U.S. PATENT DOCUMENTS

| | | | | |
|---|---|---|---|---|
| 4,794,278 A * | 12/1988 | Vajdic | G05F 3/205 | 327/309 |
| 4,818,900 A * | 4/1989 | Klass | G11C 16/08 | 326/120 |
| 4,830,976 A * | 5/1989 | Morris | G05F 3/262 | 257/379 |
| 4,833,342 A * | 5/1989 | Kiryu | G05F 3/247 | 327/541 |
| 4,843,257 A * | 6/1989 | Ohsawa | G05F 1/465 | 327/100 |
| 5,010,385 A * | 4/1991 | Shoemaker | H01L 27/0802 | 257/E27.047 |
| 5,079,441 A * | 1/1992 | Scott | H01L 27/0623 | 326/103 |
| 5,218,235 A * | 6/1993 | Patterson | H03K 5/1532 | 307/39 |
| 5,311,115 A * | 5/1994 | Archer | H01L 27/0883 | 323/315 |
| 5,498,557 A * | 3/1996 | Negishi | H01L 21/28008 | 438/158 |
| 5,548,248 A * | 8/1996 | Wang | H03F 3/19 | 330/288 |
| 5,966,005 A * | 10/1999 | Fujimori | G05F 3/262 | 323/315 |
| 6,005,378 A * | 12/1999 | D'Angelo | G05F 3/242 | 323/273 |
| 6,091,286 A * | 7/2000 | Blauschild | G05F 3/245 | 327/538 |
| 6,133,764 A * | 10/2000 | Griffith | H03K 3/3565 | 327/65 |
| 6,265,857 B1 * | 7/2001 | Demsky | G05F 3/245 | 323/312 |
| 6,504,424 B1 * | 1/2003 | Heminger | G05F 1/56 | 327/312 |
| 6,552,603 B2 * | 4/2003 | Ueda | G05F 3/24 | 323/313 |
| 7,132,873 B2 * | 11/2006 | Hollmer | H01L 27/0266 | 327/312 |
| 8,304,308 B2 * | 11/2012 | Yang | H01L 27/0826 | 438/234 |
| 10,879,901 B2 * | 12/2020 | Durham | H03K 17/6874 | |
| 2002/0036488 A1 * | 3/2002 | Ueda | G05F 3/24 | 323/313 |
| 2002/0084492 A1 | 7/2002 | Osanai et al. | | |
| 2002/0163385 A1 * | 11/2002 | Ikeda | H03F 3/45183 | 330/261 |
| 2004/0189350 A1 * | 9/2004 | Morimoto | H01L 27/0255 | 327/65 |
| 2004/0239668 A1 * | 12/2004 | Morosawa | G09G 3/3283 | 345/212 |
| 2005/0140427 A1 * | 6/2005 | Kamijo | H03K 5/2481 | 327/536 |
| 2006/0026547 A1 * | 2/2006 | Aggarwal | H01L 27/0207 | 257/202 |
| 2008/0272843 A1 * | 11/2008 | Krauss | H03F 1/301 | 330/253 |
| 2009/0108946 A1 * | 4/2009 | Lee | H03B 5/1228 | 331/1 R |
| 2009/0116273 A1 * | 5/2009 | Shiratake | G11C 11/22 | 365/72 |
| 2009/0189668 A1 * | 7/2009 | Morino | G06F 1/28 | 327/306 |
| 2010/0127782 A1 * | 5/2010 | Karp | H03F 1/523 | 330/298 |
| 2010/0252865 A1 * | 10/2010 | Van | H01L 27/0203 | 257/252 |
| 2010/0321845 A1 * | 12/2010 | Imura | G05F 1/569 | 361/86 |
| 2010/0327842 A1 | 12/2010 | Seok et al. | | |
| 2011/0024828 A1 * | 2/2011 | Takeuchi | H01L 27/11 | 257/329 |
| 2011/0121367 A1 * | 5/2011 | Yoshimura | H01L 27/0207 | 257/208 |
| 2011/0141078 A1 * | 6/2011 | Raynor | G01J 1/18 | 345/207 |
| 2011/0304387 A1 * | 12/2011 | Hirashiki | G05F 3/262 | 327/542 |
| 2012/0126873 A1 * | 5/2012 | Kobayashi | G05F 3/26 | 327/306 |
| 2012/0206119 A1 * | 8/2012 | Sugiura | G05F 1/56 | 323/282 |
| 2014/0077230 A1 * | 3/2014 | Horng | H01L 27/0814 | 257/77 |
| 2014/0167859 A1 * | 6/2014 | Bettencourt | G05F 3/262 | 330/296 |
| 2014/0284714 A1 * | 9/2014 | Miyakoshi | H01L 29/7826 | 257/337 |
| 2015/0145495 A1 * | 5/2015 | Tournatory | H02M 3/156 | 323/282 |
| 2015/0214359 A1 * | 7/2015 | Toda | H01L 29/7816 | 257/337 |
| 2016/0258995 A1 * | 9/2016 | Hikichi | G01R 31/2829 | |
| 2017/0033211 A1 * | 2/2017 | Xue | H03B 19/14 | |
| 2017/0040317 A1 * | 2/2017 | Tegen | H01L 29/086 | |
| 2017/0222010 A1 * | 8/2017 | Weis | H01L 29/456 | |
| 2018/0308843 A1 * | 10/2018 | Schober | H03F 3/45179 | |
| 2019/0123729 A1 * | 4/2019 | Minami | H03M 1/12 | |
| 2020/0081475 A1 * | 3/2020 | Marinca | G05F 3/20 | |
| 2020/0233045 A1 * | 7/2020 | Hikichi | G01R 33/0082 | |

FOREIGN PATENT DOCUMENTS

| | | |
|---|---|---|
| JP | 2009-064152 A | 3/2009 |
| JP | 2012-531825 | 12/2012 |

* cited by examiner

REFERENCE VOLTAGE CIRCUIT INCLUDING DEPLETION TYPE AND ENHANCEMENT TYPE TRANSISTORS IN A COMMON CENTROID ARRANGEMENT

RELATED APPLICATIONS

This application claims priority under 35 U.S.C. § 119 to Japanese Patent Application Nos. 2017-109043 filed Jun. 1, 2017 and 2018-060317 filed Mar. 27, 2018, the entire content of which are hereby incorporated by reference.

BACKGROUND OF THE INVENTION

Field of the Invention

The present invention relates to a reference voltage circuit and a semiconductor device.

Background Art

There has been known as a reference voltage circuit, a reference voltage circuit 700 in which such depletion type and enhancement type transistors as illustrated in FIG. 7 are combined (refer to, for example, Japanese Unexamined Patent Application Publication No. 2012-531825).

The reference voltage circuit 700 is equipped with a depletion type transistor 710, an enhancement type transistor 720, and a terminal 730 which outputs a reference voltage VREF.

The operation of the reference voltage circuit 700 will be described with reference to FIG. 8. The threshold voltage of the transistor 710 is VTND, and the relationship between the voltage and the current of the transistor 710 is shown as a curve 801. The threshold voltage of the transistor 720 is VTNE, and the relationship between the voltage and the current of the transistor 720 is shown as a curve 802. A voltage generated by making a current based on the value of the intercept of the curve 801 flow into the enhancement type transistor 720 is output to the terminal 730 as the reference voltage VREF.

SUMMARY OF THE INVENTION

It has generally been known that a semiconductor device causes a characteristic variation with the influence of stress due to its resin encapsulation (packaging).

For example, when stress is applied in an x-axis direction where a semiconductor device having the transistors 710 and 720 arranged in the x-axis direction is resin-encapsulated, there is a possibility that the characteristic fluctuations of the transistors 710 and 720 will deviate. That is, the curves 801 and 802 respectively have a possibility of deviating from a desired characteristic.

The present invention has been made to avoid the influence of a characteristic fluctuation due to stress in the resin encapsulation of a semiconductor device or the like and provides a semiconductor device equipped with a reference voltage circuit with less product variation.

There is provided a reference voltage circuit of the present invention, in which a depletion type transistor or/and an enhancement type transistor are respectively configured of a plurality of transistors and arranged in the form of a common centroid (common center of mass).

According to the reference voltage circuit of the present invention, it is possible to provide a semiconductor device equipped with a reference voltage circuit which avoids the influence of a characteristic fluctuation due to stress in the resin encapsulation of the semiconductor device or the like and provides less product variation.

DETAILED DESCRIPTION OF THE EMBODIMENTS

Figure 1:
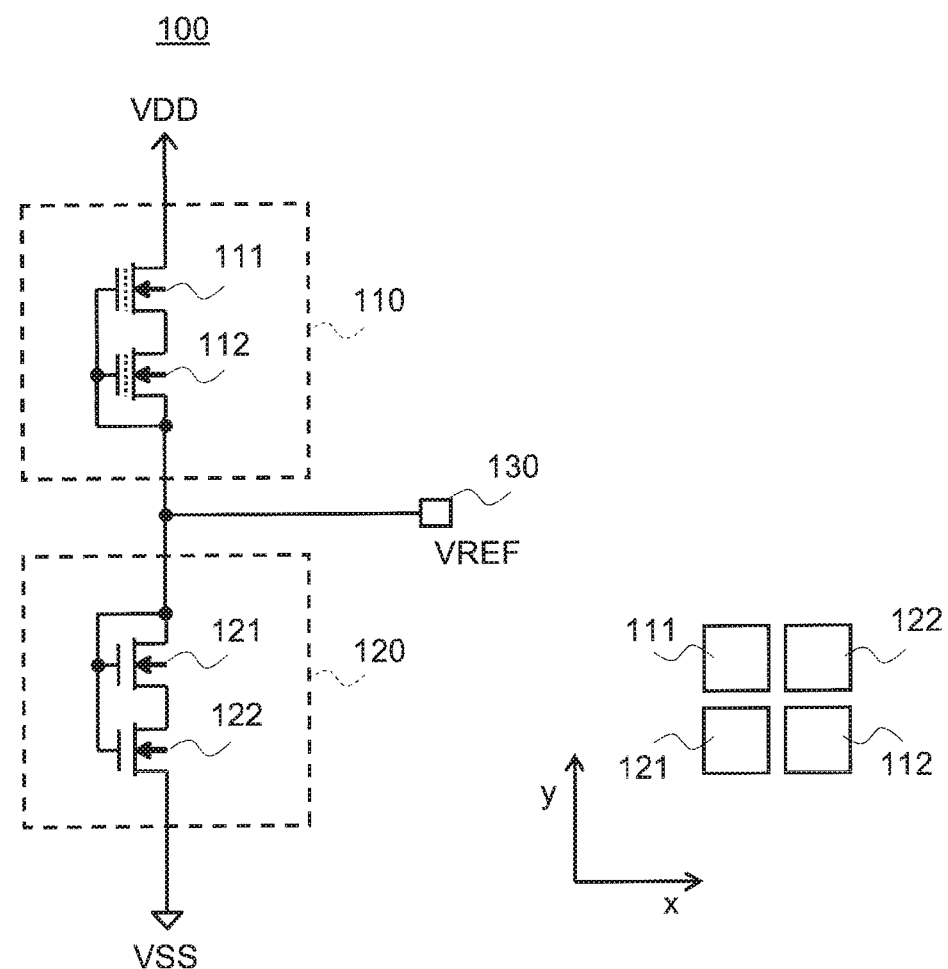
FIG. 1 is an explanatory diagram illustrating a reference voltage circuit according to a first embodiment of the present invention.

FIG. 1 is an explanatory diagram illustrating a reference voltage circuit according to a first embodiment of the present invention.

The reference voltage circuit 100 is equipped with a depletion type transistor 110, an enhancement type transistor 120, and a terminal 130 which outputs a reference voltage VREF.

The transistor 110 is configured to connect two depletion type transistors 111 and 112 in series. The transistor 120 is configured to connect two transistors 121 and 122 in series.

The reference voltage circuit 100 is similar in operation to a general reference voltage circuit comprised of a depletion type transistor 110 and an enhancement type transistor 120 and outputs the reference voltage VREF to the terminal 130.

Here, the reference voltage circuit 100 is configured to set the transistors 111 and 112 to be the same size (W length and L length) and set the transistors 121 and 122 to be the same size (W length and L length). Then, the transistors 111, 112, 121, and 122 are arranged on a semiconductor device approximately in the form of a common centroid (common center of mass) as illustrated in FIG. 1.

That is, the transistor pair 111 and 112, and the transistor pair 121 and 122 are arranged point-symmetrically to have respective center of mass at substantially the same position to realize the common centroid (common center of mass).

In the reference voltage circuit 100 arranged as described above, even if the characteristics of the transistors change in an x-axis or y-axis direction due to stress in resin encapsulation or the like, the transistor 110 and the transistor 120 are subjected to the same influence. Thus, there is brought about an advantageous effect that since the transistors 110 and 120 cause the same characteristic variation, it is possible to reduce a deviation of its variation characteristic from a desired voltage/current characteristic.

As described above, since the transistor 110 and the transistor 120 are arranged on the semiconductor device approximately in the form of the common centroid in the reference voltage circuit 100, it is possible to provide a semiconductor device equipped with a reference voltage circuit which avoids the influence of a characteristic fluctuation due to the stress in the resin encapsulation of the semiconductor device or the like and provides less product variation.

Figure 2:
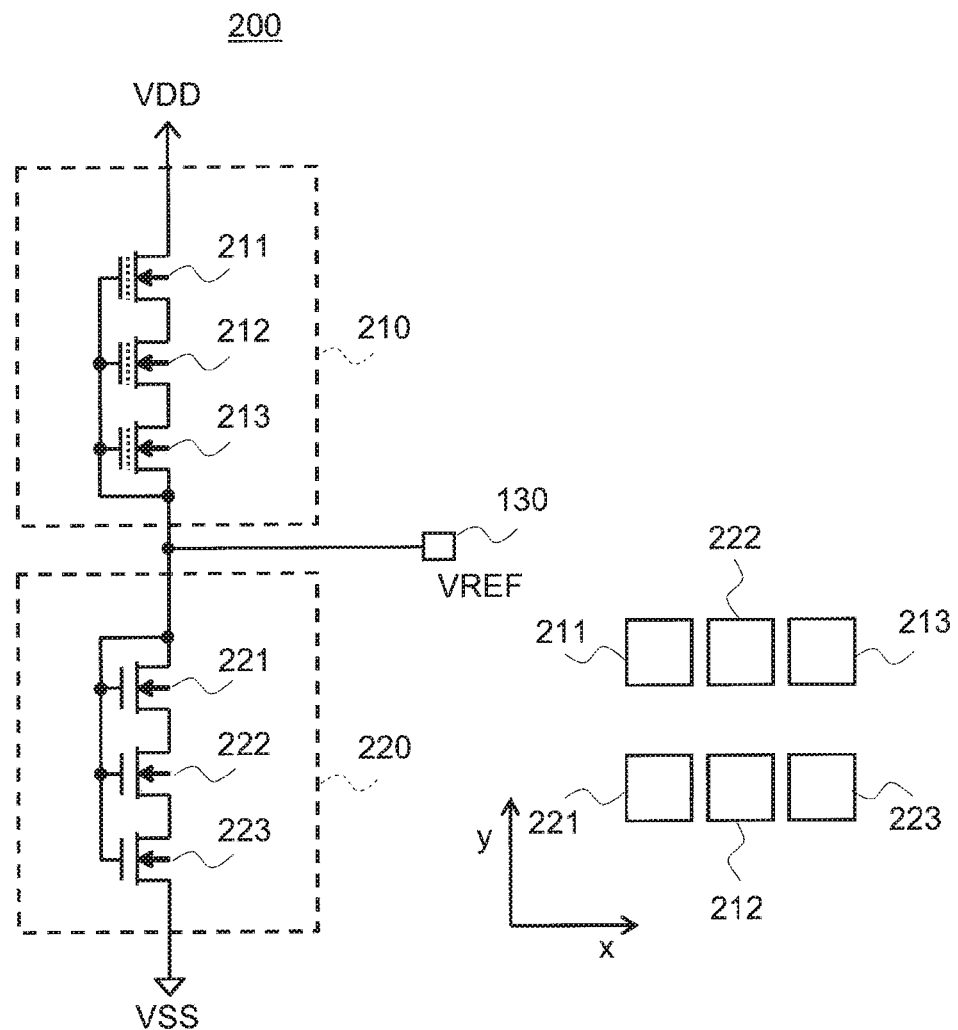
FIG. 2 is an explanatory diagram illustrating another example of the reference voltage circuit according to the first embodiment.

FIG. 2 is an explanatory diagram illustrating another example of the reference voltage circuit according to the first embodiment.

The reference voltage circuit 200 includes a depletion type transistor 210 and an enhancement type transistor 220 respectively configured from three transistors.

The transistor 210 is configured from three depletion type transistors 211, 212, and 213 connected in series. The transistor 220 is configured from three transistors 221, 222, and 223 connected in series.

Here, the respective transistors are configured as with the reference voltage circuit 100 and arranged on a semiconductor device approximately in the form of a common centroid (common center of mass) as illustrated in FIG. 2. The reference voltage circuit 200 configured in this manner is also capable of obtaining a similar effect.

Figure 3:
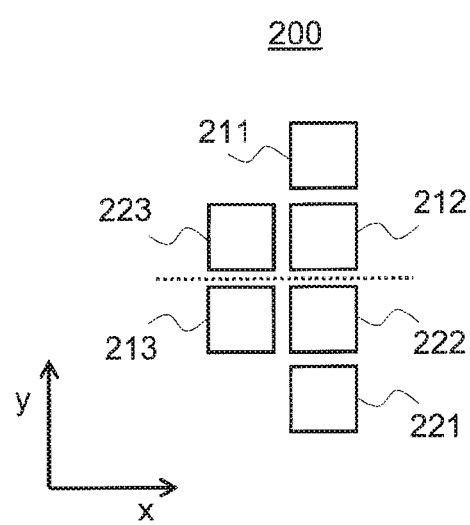
FIG. 3 is an explanatory diagram illustrating a further example of the reference voltage circuit according to the first embodiment.

Further, the reference voltage circuit 200 may be arranged on a semiconductor device approximately in the form of a common centroid (common center of mass) as illustrated in FIG. 3. That is, the transistors 211, 212, and 223, and the transistors 213, 221, and 222 are arranged in linear symmetry to realize the common centroid (common center of mass).

Figure 4:
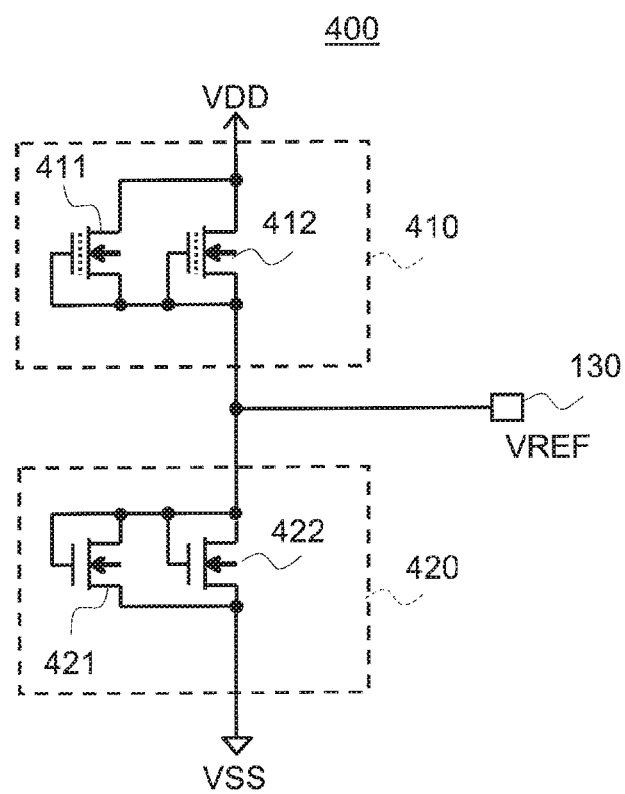
FIG. 4 is an explanatory diagram illustrating yet another example of the reference voltage circuit according to the first embodiment.

FIG. 4 is an explanatory diagram illustrating yet another example of the reference voltage circuit according to the first embodiment.

The reference voltage circuit 400 includes a depletion type transistor 410 and an enhancement type transistor 420 respectively configured from two transistors.

The transistor 410 is configured from two depletion type transistors 411 and 412 connected in parallel. The transistor 420 is configured from two transistors 421 and 422 connected in parallel.

As with the reference voltage circuit 100 illustrated in FIG. 1, the reference voltage circuit 400 is arranged on a semiconductor device approximately in the form of a common centroid (common center of mass). The reference voltage circuit 400 configured in this manner is also capable of obtaining a similar effect.

Incidentally, although the reference voltage circuit 400 includes the transistors respectively configured to connect the two transistors in parallel, more than two may be connected in parallel and arranged on a semiconductor device approximately in the form of a common centroid (common center of mass).

Figure 5:
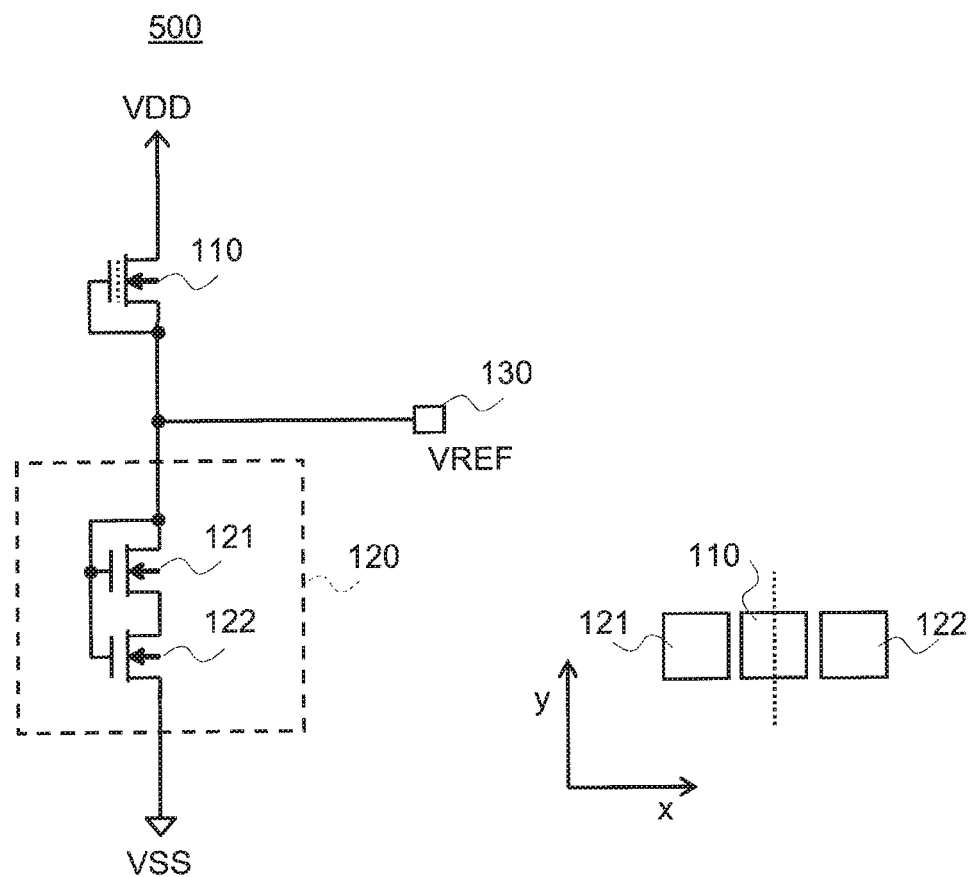
FIG. 5 is an explanatory diagram illustrating a still further example of the reference voltage circuit according to the first embodiment.

FIG. 5 is an explanatory diagram illustrating a still further example of the reference voltage circuit according to the first embodiment.

The reference voltage circuit 500 is equipped with a depletion type transistor 110, an enhancement type transistor 120, and a terminal 130 which outputs a reference voltage VREF. The transistor 120 is configured from two transistors 121 and 122 connected in series.

Although the depletion type transistor 110 is configured from the two depletion type transistors 111 and 112 connected in series in the reference voltage circuit 100 of FIG. 1, the depletion type transistor 110 can be arranged on a semiconductor device approximately in the form of a common centroid (common center of mass) even if the depletion type transistor 110 is formed from one transistor as illustrated in FIG. 5.

Incidentally, although there has been described the example in which the depletion type transistor 110 is comprised of one transistor in the reference voltage circuit 500 in FIG. 5, the enhancement type transistor 120 may be comprised of one transistor.

Although the above-described reference voltage circuit according to the first embodiment includes the transistors respectively configured from one to three transistors, more than three may be connected in series or parallel and arranged on the semiconductor device approximately in the form of the common centroid (common center of mass).

Figure 6:
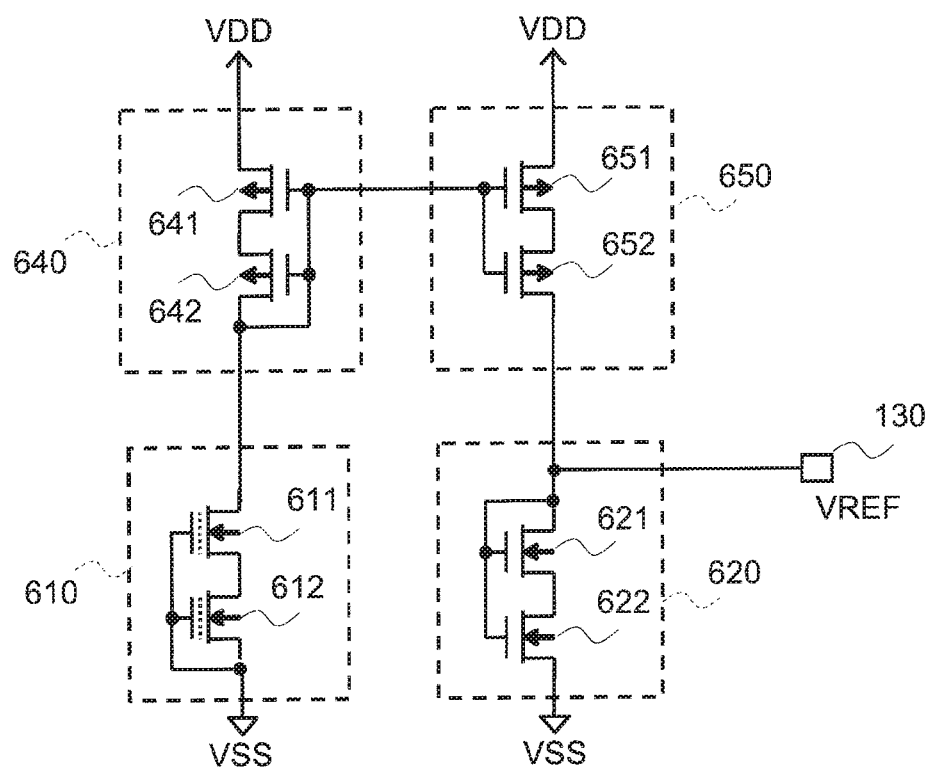
FIG. 6 is an explanatory diagram illustrating a reference voltage circuit according to a second embodiment of the present invention.
Figure 7:
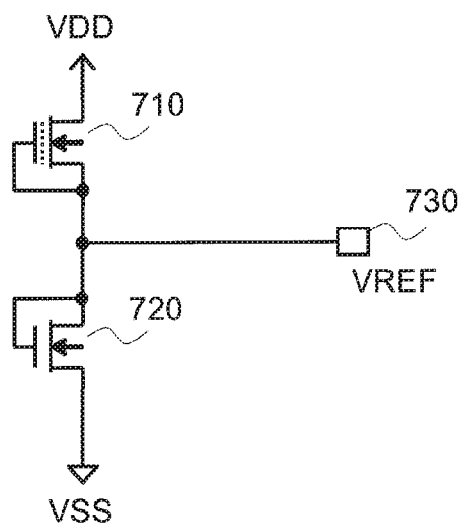
FIG. 7 is a circuit diagram illustrating a general reference voltage circuit.
Figure 8:
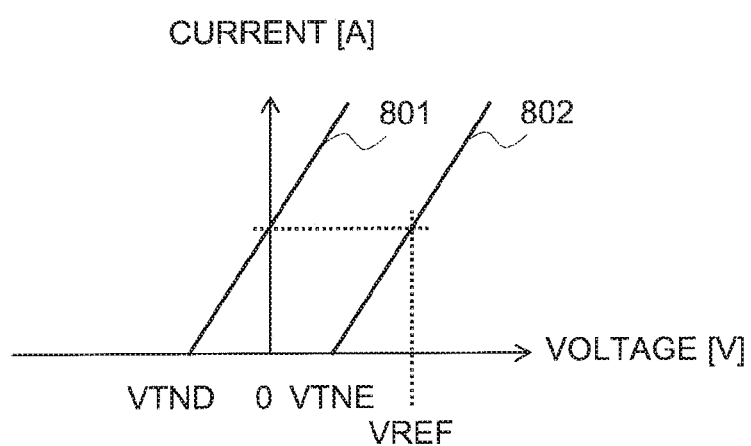
FIG. 8 is an operation explanatory diagram of the reference voltage circuit illustrated in FIG. 7.

FIG. 6 is an explanatory diagram illustrating a reference voltage circuit according to a second embodiment of the present invention.

The reference voltage circuit 600 has a depletion type transistor 610, an enhancement type transistor 620, and transistors 640 and 650 which form a current mirror circuit. The reference voltage circuit 600 is configured by coupling the transistors 610 and 620 with the current mirror circuit and is similar in basic operation to the reference voltage circuit according to the first embodiment. The reference voltage circuit 600 is formed from a plurality of transistors as with the reference voltage circuit according to the first embodiment.

The transistor 610 is configured from two depletion type transistors 611 and 612 connected in series. The transistor 620 is configured from two transistors 621 and 622 connected in series. The transistor 640 is configured from two transistors 641 and 642 connected in series. The transistor 650 is configured from two transistors 651 and 652 connected in series.

The respective transistors are configured as with those in the reference voltage circuit according to the first embodiment. Further, as with the reference voltage circuit 100, for example, the transistors 610 and 620 are arranged on a semiconductor device approximately in the form of a common centroid (common center of mass), and the transistors 640 and 650 are arranged on the semiconductor device approximately in the form of the common centroid (common center of mass). The reference voltage circuit 600 configured in this manner is also capable of obtaining a similar effect.

Incidentally, although the reference voltage circuit 600 according to the second embodiment includes the transistors respectively configured from the two transistors, more than two may be connected in series or parallel as with the first embodiment and arranged on the semiconductor device approximately in the form of the common centroid (common center of mass).

What is claimed is:

1. A reference voltage circuit comprising:
   one or more depletion type transistors;
   one or more enhancement type transistors which is connected in series with the depletion type transistor; and
   an output terminal directly coupled to the location where the enhancement type transistor is connected in series with the depletion type transistor, the output terminal configured to output the reference voltage of the reference voltage circuit,
   at least one of the depletion type transistor and the enhancement type transistor being comprised of a plurality of transistors two-dimensionally arranged along a first direction and a second direction, and
   the one or more depletion type transistors and the one or more enhancement type transistors which are arranged in the form of a common centroid (common center of mass), and of which the one or more depletion type transistors face to the one or more enhancement type transistors across each of a first line and a second line, where the first line is parallel to the first direction and the second line is parallel to the second direction.

2. The reference voltage circuit according to claim 1, wherein the one or more depletion type transistors and the one or more enhancement type transistors are arranged point-symmetrically.

3. The reference voltage circuit according to claim 1, wherein the one or more depletion type transistors and the one or more enhancement type transistors are arranged in linear symmetry.

4. The reference voltage circuit according to claim 1, wherein a source of at least one of the one or more depletion type transistors is directly connected to a drain of at least one of the one or more enhancement type transistors.

5. The reference voltage circuit according to claim 1, wherein the one or more depletion type transistors comprises a plurality of transistors.

6. The reference voltage circuit according to claim 1, wherein the one or more depletion type transistors comprises a plurality of depletion type transistors and the one or more enhancement type transistors comprises a plurality of enhancement type transistors.

\* \* \* \* \*

UNITED STATES PATENT AND TRADEMARK OFFICE
CERTIFICATE OF CORRECTION

| | |
|---|---|
| PATENT NO. | : 11,275,399 B2 |
| APPLICATION NO. | : 15/994075 |
| DATED | : March 15, 2022 |
| INVENTOR(S) | : Sugiura et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 477 days.

Signed and Sealed this
Thirty-first Day of January, 2023

Katherine Kelly Vidal
*Director of the United States Patent and Trademark Office*